(12) United States Patent
Kye (10) Patent No.: US 8,916,925 B2
(45) Date of Patent: Dec. 23, 2014

(54) VERTICAL SEMICONDUCTOR DEVICE AND METHOD OF MANUFACTURING THE SAME

(75) Inventor: Jeong Seob Kye, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 602 days.

(21) Appl. No.: 12/981,421

(22) Filed: Dec. 29, 2010

(65) Prior Publication Data

US 2012/0146131 A1 Jun. 14, 2012

(30) Foreign Application Priority Data

Dec. 14, 2010 (KR) ........................ 10-2010-0127655

(51) Int. Cl.
*H01L 29/78* (2006.01)
*H01L 27/108* (2006.01)
*H01L 29/66* (2006.01)

(52) U.S. Cl.
CPC ...... *H01L 29/7827* (2013.01); *H01L 27/10876* (2013.01); *H01L 29/66666* (2013.01)
USPC ............ 257/329; 257/E29.262; 257/E21.158; 438/586

(58) Field of Classification Search
CPC .............. H01L 27/10876; H01L 27/10885; H01L 27/10888; H01L 29/66666; H01L 29/7827

USPC ............ 257/329, E29.262, E21.158, E21.19; 438/586

See application file for complete search history.

(56) References Cited

U.S. PATENT DOCUMENTS

| | | | | |
|---|---|---|---|---|
| 5,874,760 A | * | 2/1999 | Burns et al. | .................... 257/315 |
| 6,437,388 B1 | * | 8/2002 | Radens et al. | ................. 257/301 |
| 2006/0097304 A1 | | 5/2006 | Yoon et al. | |
| 2009/0236656 A1 | | 9/2009 | Sung et al. | |
| 2010/0090263 A1 | * | 4/2010 | Kunkel et al. | .................. 257/296 |
| 2010/0213524 A1 | | 8/2010 | Jeon et al. | |

FOREIGN PATENT DOCUMENTS

| | | |
|---|---|---|
| KR | 10-2006-0041415 A | 5/2006 |
| KR | 10-2009-0100902 A | 9/2009 |
| KR | 10-2010-0097468 A | 9/2010 |

* cited by examiner

*Primary Examiner* — Ermias Woldegeorgis (57) ABSTRACT

A vertical semiconductor device includes a first active pillar vertically protruded from a semiconductor substrate; a first vertical gate connected to at least one side of the first active pillar and formed along a direction that crosses a buried bit line; and a first body line connected to at least one side of the first active pillar which is not connected to the first vertical gate.

7 Claims, 11 Drawing Sheets

VERTICAL SEMICONDUCTOR DEVICE AND METHOD OF MANUFACTURING THE SAME

CROSS-REFERENCES TO RELATED APPLICATION

The priority of Korean patent application No. 10-2010-0127655 filed on Dec. 14, 2010, the disclosure of which is hereby incorporated in its entirety by reference, is claimed.

BACKGROUND OF THE INVENTION

1. Technical Field

The present invention relates to a vertical semiconductor device and a method of manufacturing the same, and more particularly, to a vertical semiconductor device capable of preventing a floating body effect from occurring and overlapping a vertical gate and a bit line junction region.

2. Related Art

As integration of semiconductor devices is high, dynamic random access memory (DRAM) devices of below 40 nm have been used to improve device integration. However, it is difficult to scale down planar or recess gate transistors below 40 nm, which are used in $8F^2$ (F: minimum feature size) or $6F^2$ cell architecture. Therefore, $4F^2$ cell architecture capable of improving integration one and a half to two times in a given critical dimension has been suggested.

Under $4F^2$ cell architecture, a source unit and a drain unit of a cell transistor are each required to be a $1F^2$ size. The source unit becomes coupled to a capacitor storing a carrier, e.g., electric charges, and the drain unit is coupled to a bit line from which the electric charges drain out. Thus, in recent years, study has been made of a vertical cell transistor structure in which the source unit and the drain unit are a $1F^2$ size. The vertical cell transistor is structured such that a source region and a drain region of a transistor are formed in a vertical direction and the transistor operates along a vertical pillar type channel. That is, compared to the source region and the drain region in a planar transistor in $8F^2$, a vertical cell transistor structure with a vertically arranged source region and drain region can be formed in a smaller size.

In the $4F^2$ cell architecture, a bit line junction region is formed in a lower portion of a pillar to be a one side contact (OSC) type.

However, if the bit line junction region is shallow, and thus a gate and the bit line junction region are not overlapped with each other, channel resistance increases and thus, threshold voltage becomes increased and a channel current becomes reduced.

On the other hand, if the bit line junction region is deep, and thus a gate and the bit line junction region overlap, the width of a channel becomes narrow and a floating body phenomenon occurs, isolating the channel region from the substrate by the bit line junction region.

SUMMARY

The present invention is to improve operation characteristics of a semiconductor device by effectively preventing a floating body effect from occurring while having a gate and a bit line junction region that are overlapped with each other in a vertical semiconductor device.

According to one aspect of an exemplary embodiment, a vertical semiconductor device includes a first active pillar vertically that protrudes from a semiconductor substrate; a first vertical gate connected to at least one side of the first active pillar and formed along a direction that crosses a buried bit line; and a first body line connected to at least one side of the first active pillar which is not connected to the first vertical gate.

The vertical semiconductor device may further include an insulating layer formed on one sidewall of the first vertical gate; a second vertical gate symmetrically formed with the first vertical gate on the basis of the insulating layer; a second active pillar of which at least one side is connected to the second vertical gate; and a second body line symmetrically formed with the first body line on the basis of the insulating layer and connected to at least one side of the second active pillar which is not connected to the second vertical gate.

The vertical semiconductor device may further include a third is active pillar that is symmetrical to the first active pillar across the first body line and that is connected to the first body line; and a third vertical gate that is symmetrical to the first vertical gate across the first body line and that is connected to at least one side of the third active pillar that is not connected to the first body line.

The first body line may be formed in a line type parallel to the first vertical gate.

The first vertical gate may be formed to surround the first active pillar in a "U" shape. When the first active pillar is formed as a square pillar type, the first gate may be formed to surround three sides of four sides of the first active pillar. At this time, the first body line may be connected to the remaining side of the first active pillar.

According to another aspect of another exemplary embodiment, a method of manufacturing a vertical semiconductor device includes forming silicon line patterns by etching a semiconductor substrate; forming a buried bit line in a lower portion of a first trench between the silicon line patterns; forming an insulating layer to be filled within the first trench; forming a second trench defining a vertical gate region by etching the silicon line pattern and the insulating layer; forming a conduction layer within the second trench; device-isolating the conduction layer to form vertical gates; forming a third trench defining a body line region by etching the silicon line pattern between adjacent second trenches and the insulating layer; and filling a conduction layer within the third trench to form a body line.

The method may further include, before the formation of a is buried bit line, forming a bit line contact on each of one side of two sides of the silicon line patterns facing each other with the first trench therebetween.

The second trench may separate the silicon line patterns in a constant distance and is formed to expose three sides of both end portions of the separated silicon line pattern.

The formation of a vertical gate may include separating the first conduction layer along a direction that crosses the buried bit line so that the separated first conduction layer surrounds three sides of both end portions of the silicon line pattern.

The method may further include forming an interlayer insulating layer on the first conduction layer to be filled with the second trench.

The third trench may be formed so that the insulating layer remains between the body line region and the vertical gate region.

The silicon line patterns may be separated by the third trench to form active pillars.

According to another aspect of another exemplary embodiment, a method of manufacturing a vertical semiconductor device includes forming bar type silicon line patterns to be spaced apart from each other; forming a vertical gate and a second vertical gate for connecting both end portions of adjacent silicon line patterns along a first direction; respectively; forming active pillars by etching central portions of the adjacent silicon line patterns along the first direction; and forming a body line connected to sides of the active pillars along the first direction.

The formation of bar type silicon line patterns may include is forming line type silicon line patterns by etching a semiconductor substrate; forming a buried bit line at a lower portion of a first trench between the line type silicon line patterns; forming an insulating layer to be filled within the first trench; and etching the line type silicon line patterns and the insulating layer with a vertical gate mask to define a vertical gate region to form a second trench and a third trench.

The formation of a first vertical gate and a second vertical gate may include forming a first conduction layer and a second conduction layer within the second trench and the third trench, and device-isolating the first conduction layer and the second conduction layer.

The formation of active pillars may include etching the silicon line pattern between the first conduction layer and the second conduction layer and the insulating layer with a body mask to define a body line region and to form a fourth trench.

The formation of a body line may include forming a third conduction layer with the fourth trench.

In the present invention, the gate and the bit line junction region can overlap, which prevents a floating body effect from occurring.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description, taken in conjunction is with the accompanying drawings, in which.

DESCRIPTION OF EXEMPLARY EMBODIMENT

Exemplary embodiments are described herein with reference to cross-sectional illustrations that are schematic illustrations of exemplary embodiments and intermediate structures. As such, variations in shapes, manufacturing techniques, and/or tolerances are to be expected. Thus, exemplary embodiments should not be construed to limit the particular shapes of device elements. Eviations in shapes that may result in the course of manufacturing should be construed falling within the scope of the present invention. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, an exemplary embodiment of the present invention will be described in further detail with reference to accompanying drawings.

Figure 1:
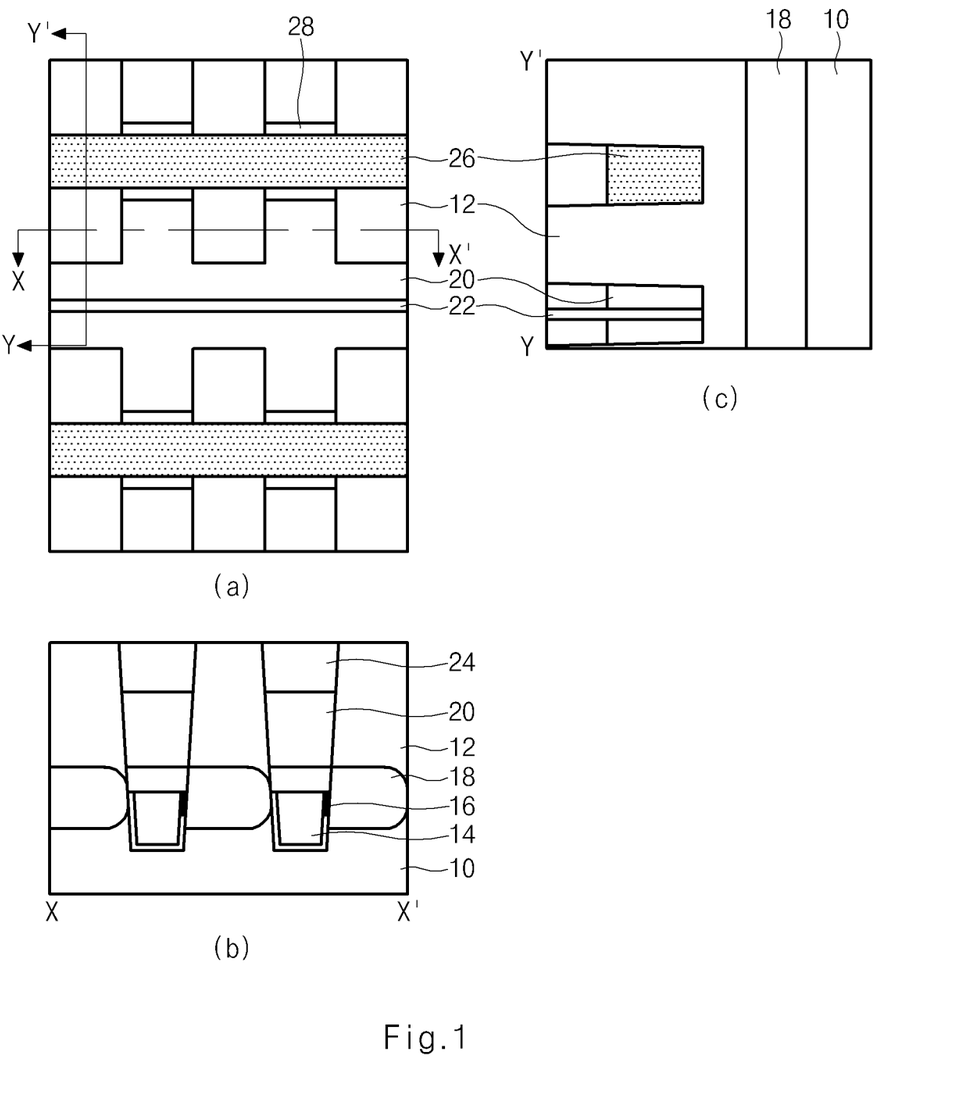
FIG. 1 is a diagram illustrating a configuration of a vertical semiconductor device according to an exemplary embodiment of the present invention.

FIG. 1 is a diagram illustrating a configuration of a vertical semiconductor device according to an exemplary embodiment of the present invention. In FIG. 1, (a) is a plan view, (b) is a cross-sectional view taken along a line X-X' of FIG. 1(a), and (c) is a cross-sectional view taken along a line Y-Y' of FIG. 1(a). For convenience of description, some elements illustrated in FIGS. 1(b) and (c) will be omitted in a plan view of FIG. 1(a).

Referring to FIG. 1, a semiconductor substrate 10 is etched to form active pillars 12, which vertically protrude from the semiconductor substrate 10. A buried bit line 14 is formed at a lower portion between the active pillars 12 in a first direction (the Y-direction in FIG. 1). The buried bit line 14 is connected to a bit line junction region 18 below the active pillars 12 via a bit line contact 16. At this time, the bit line contact 16 is a one side contact (OSC) type and is formed only at one side of each of the active pillars 12. The bit line junction region 18 is formed to partially overlap with a vertical gate 20.

The vertical gate 20 is formed over the buried bit line 14 to be extended to a direction (the X direction in FIG. 1) crossed with the buried bit line 14. The vertical gate 20 is formed to surround the active pillar 12 in a U-shape. That is, the vertical gate 20 is formed at three sidewalls of four sidewalls of one of the active pillars 12 when the active pillar 12 has four sidewalls. The vertical gate 20 is isolated from an adjacent vertical gate by an insulating layer 22. The interlayer insulating layer 24 is formed over the vertical gate 20.

A body line 26, which is a conductive interconnection, is formed to be in contact with the remaining sidewalls of the four sidewalls of the active pillar 12 which is not in contact with the vertical gate 20. In an embodiment, at least one sidewall (e.g., 2 or 3) of the active pillar 12 is in contact with the body line 26 as a conductive interconnection so that although the bit line junction region 18 is formed to a deep junction depth, holes accumulated in the body (pillar) are discharged via the body line 26 to prevent a floating body effect from occurring. The body line 26 is formed in a line type that is extended parallel to the vertical gate 20, and that is commonly connected to the active pillars 12, which are formed at both sides of the body line 26. In addition, the vertical gate 20, which are also formed at both sides of the body line 26 and are symmetrically formed with each other with respect to the body line 26. The body line 26 is isolated with the vertical gate 20 by an insulating layer 28.

The vertical gate 20 and the body line 26 may be formed of the same metal, such as tungsten, or of the same conductive material. Alternatively, the vertical gate 20 and the body line 26 may be formed of different materials.

FIGS. 2 to 11 are plan views and cross-sectional views illustrating a method of manufacturing the vertical semiconductor device of FIG. 1. In FIGS. 2 to 11, (a) is a plan view of a vertical semiconductor device, (b) is a cross-sectional view taken along line X-X', X1-X1', X2-X2' or X3-X3' of (a), and (c) is a cross-sectional view taken along a line Y-Y' of (a).

Figure 2:
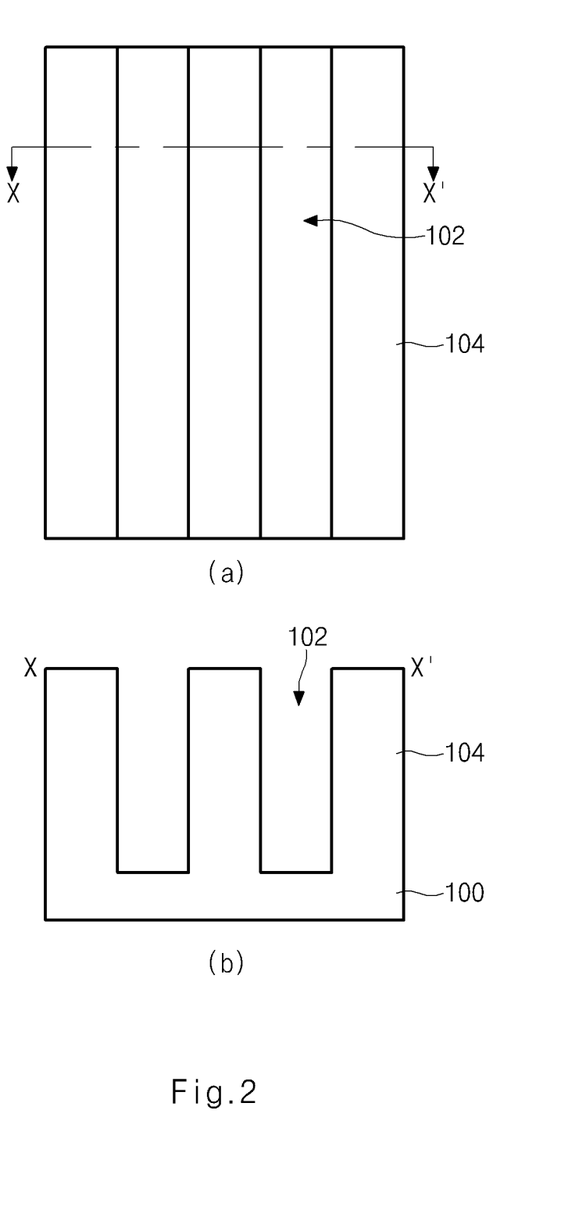
FIGS. 2 to 11 are plan views and cross-sectional views illustrating a method of manufacturing a vertical semiconductor device according to an exemplary embodiment of the present invention.

Referring to FIG. 2, a portion of a semiconductor substrate 100 is etched to form a line type trench 102 and silicon line patterns 104 in which active pillars are to be formed in the process that follows.

Figure 3:
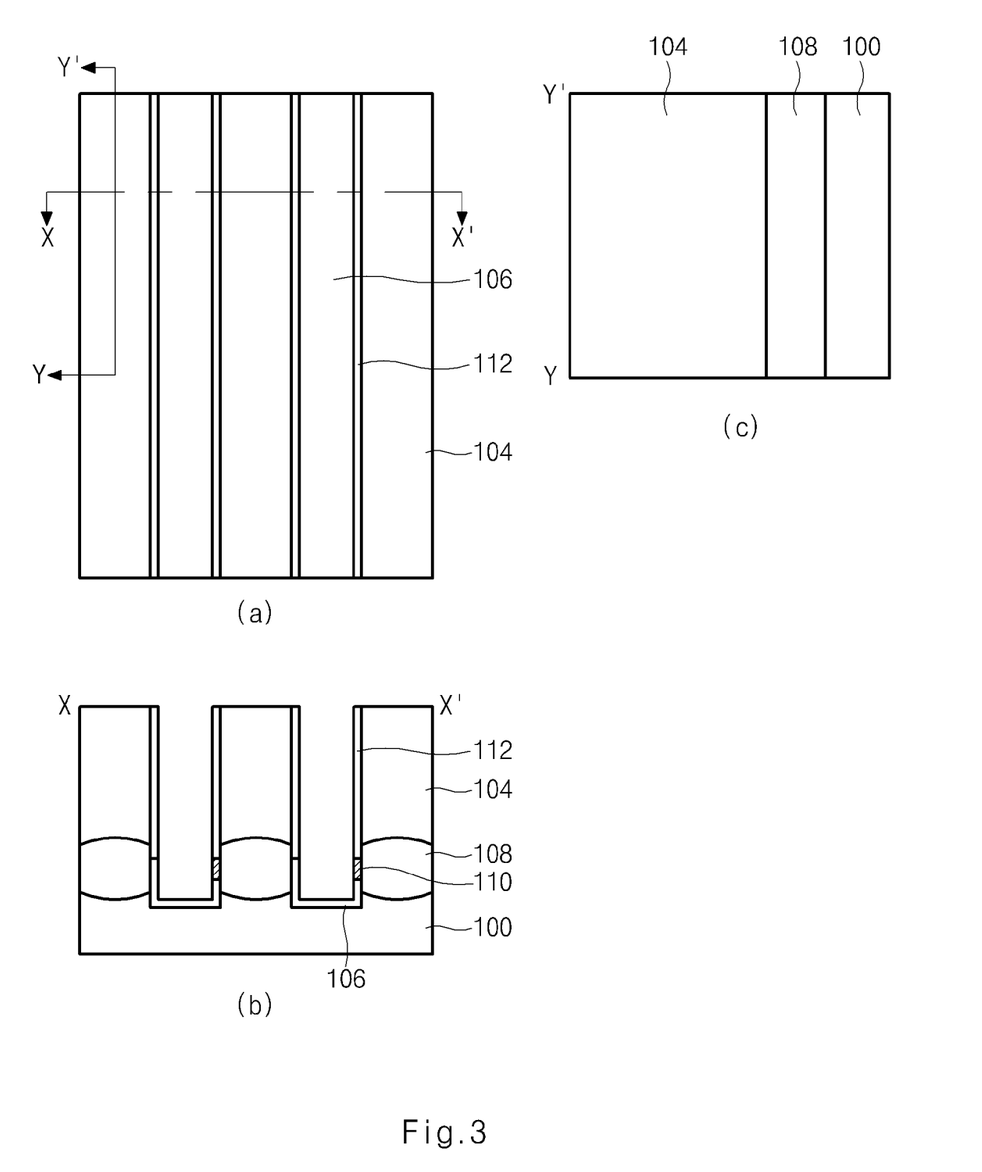

Referring to FIG. 3, an oxide layer 106 is formed on a lower inner surface of the trench 102, and a bit line junction region 108 is formed in a lower portion of the silicon line pattern 104. A bit line contact 110, which is in contact with the bit line junction region 108, is formed over the oxide layer 106. The bit line contact 110 is a one side contact (OSC) type which is formed on one sidewall of the silicon line pattern 104. A nitride layer 112 is formed over sidewalls of the silicon line pattern 104 and over the oxide layer 106 and the bit line contact 110.

The bit line junction region 108 and the OSC type bit line contact 110 for a vertical gate may be formed through various known methods. A detailed description of such methods will be omitted.

Figure 4:
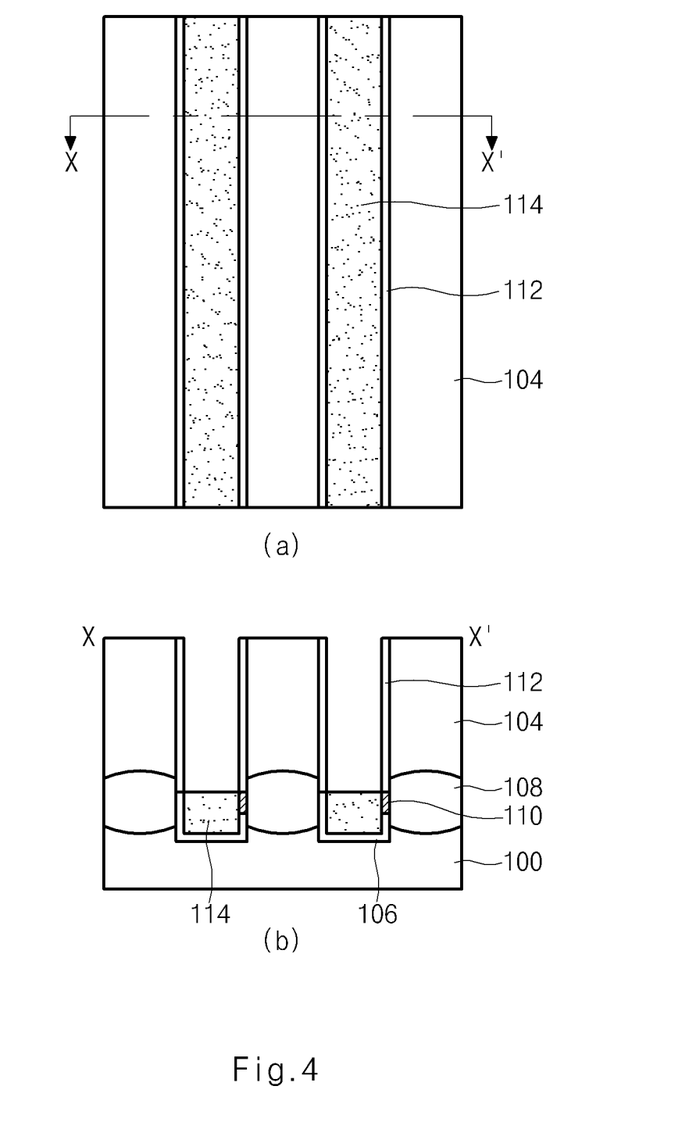

Referring to FIG. 4, a conduction layer for a bit line is filled in the trench 102 and then etched back to form a buried bit line 114, which is in contact with the bit line contact 110. At this time, the conduction layer for a bit line may include a metal material such as tungsten.

Figure 5:
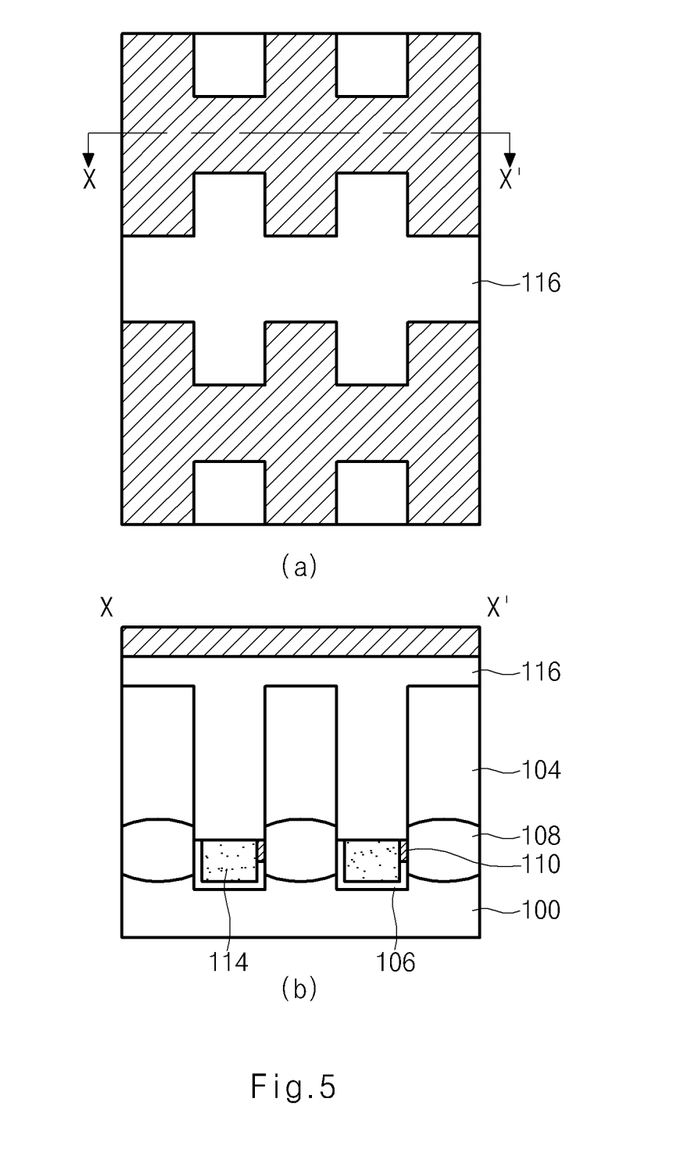

Referring to FIG. 5, a capping nitride layer 116 is filled within the trench 102 and then planarized using a chemical mechanical polishing (CMP) method. At this time, the capping nitride layer 116 may be formed over the buried bit line 114 to a thickness of about thousands Å, for example 3000 Å.

Next, a vertical gate mask defining a vertical gate region (a deviant crease lined portion of FIG. 5) is formed over the capping nitride layer 116. At this time, the vertical gate region defined by the vertical gate mask divides the silicon line pattern 104 into bar type pillar patterns, which are uniformly spaced apart. The vertical gate region is formed to is surround three sidewalls of each of the pillar patterns.

Figure 6:
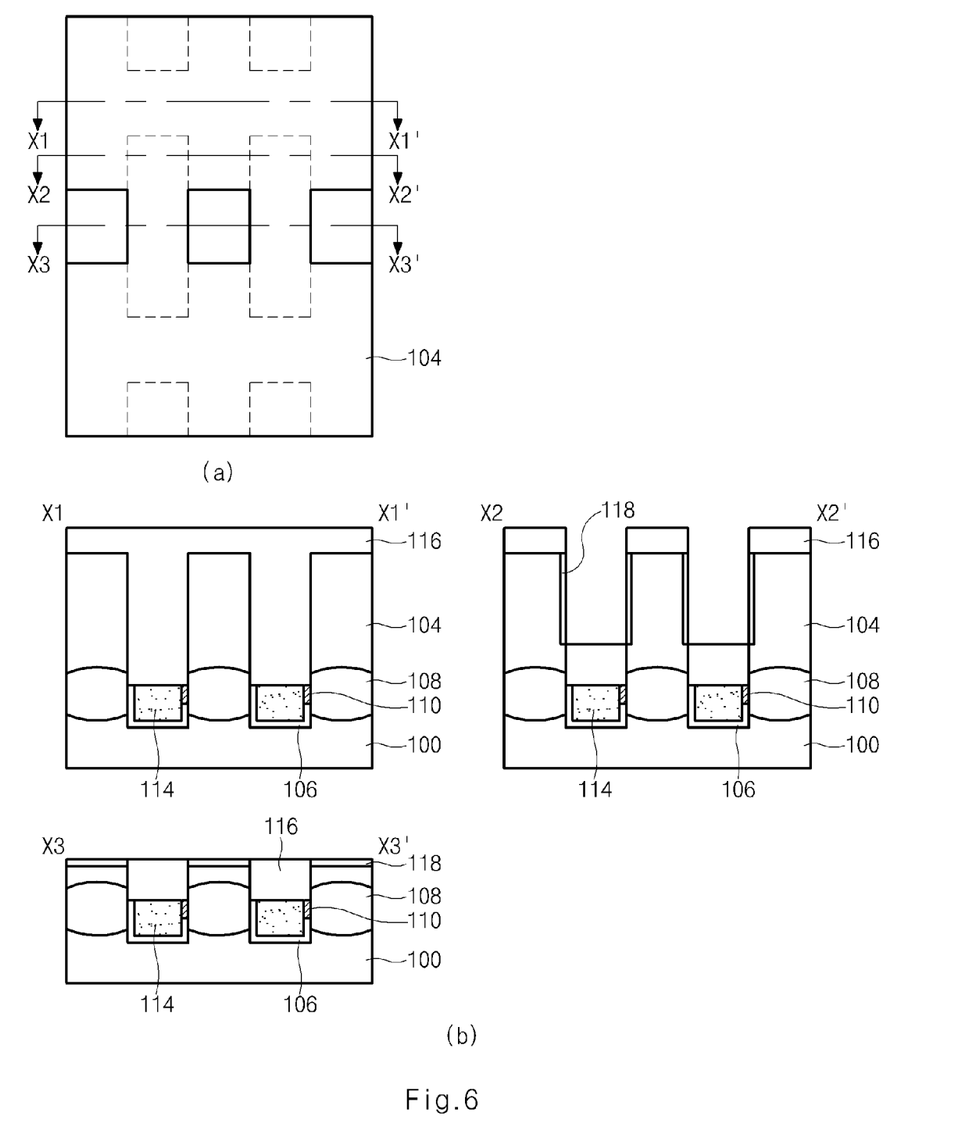

Referring to FIG. 6, the capping nitride layer 116 and the silicon line pattern 104 are etched using the vertical gate mask to form a first pillar pattern 104. At this time, the capping nitride layer 116 over the vertical gate region is etched to such a degree that some thickness of capping nitride layer 116 remains over the vertical gate region. In an embodiment, the vertical gate region has a thickness of tens to hundreds Å, for example about 100 Å. See X1-X1' cross-sectional view of FIG. 6(b). Also, the capping nitride layer 116 formed over the buried bit line 114 is etched away while leaving some thickness of capping nitride layer 116 over the buried bit line 114. In an embodiment, a vertical gate is formed to have a thickness of about 100 Å. See X2-X2' cross-sectional view of FIG. 6(b).

An annealing process is performed to form a gate oxide layer 118 on a surface of the exposed first pillar pattern 104. In an embodiment, the first pillar pattern has a thickness of 10-100 Å, for example 60 Å.

Figure 7:
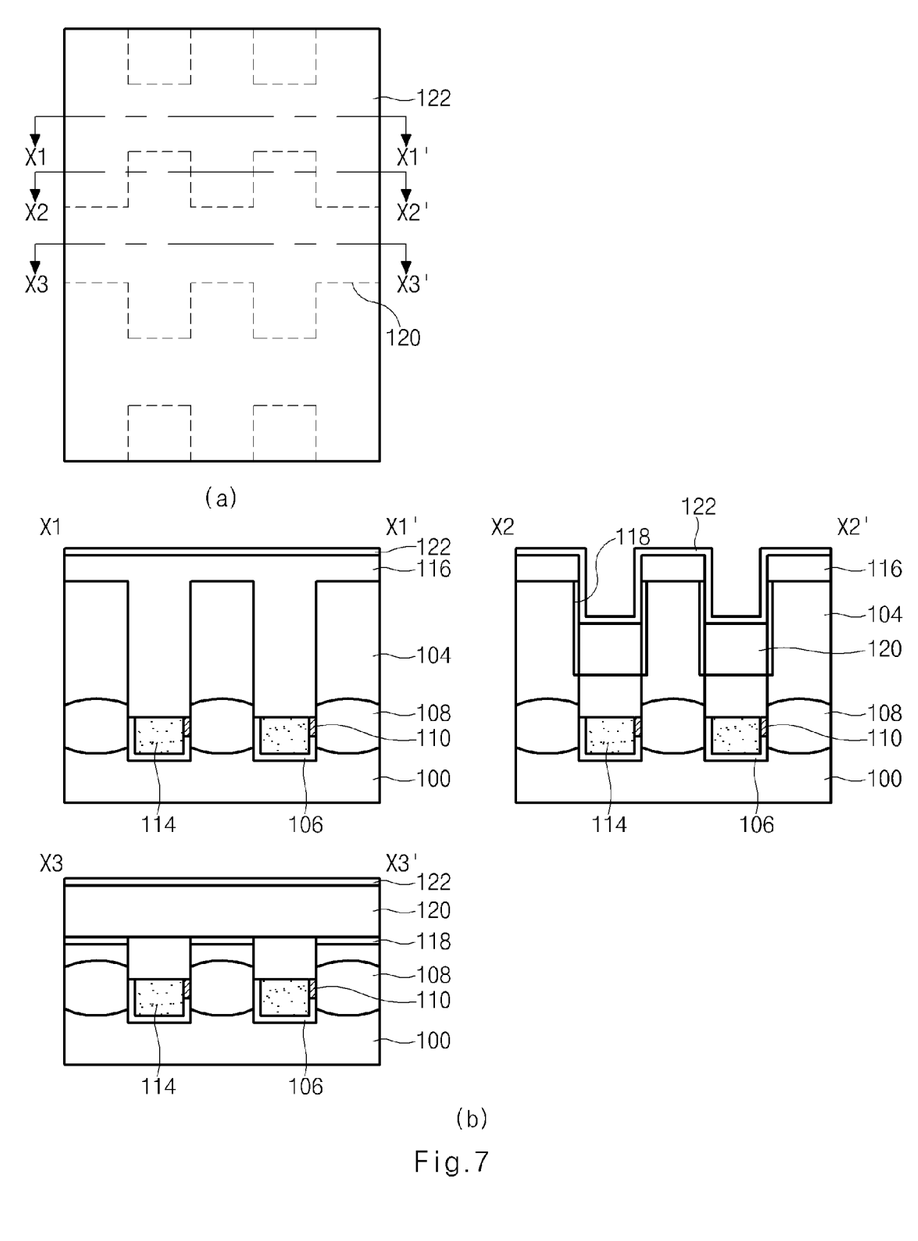

Referring to FIG. 7, a conduction layer for a vertical gate, for example, tungsten (not shown), is formed on the surface of the semiconductor substrate 100 and then planarized using a CMP process until the capping nitride layer 116 is exposed.

Next, the conduction layer for a vertical gate is etched back to form a vertical gate 120, and a sealing nitride layer 122 is formed on the surface of the semiconductor substrate 100. In an embodiment, the sealing nitride layer 122 is formed to a thickness of 10-100 Å, for is example 80 Å.

Figure 8:
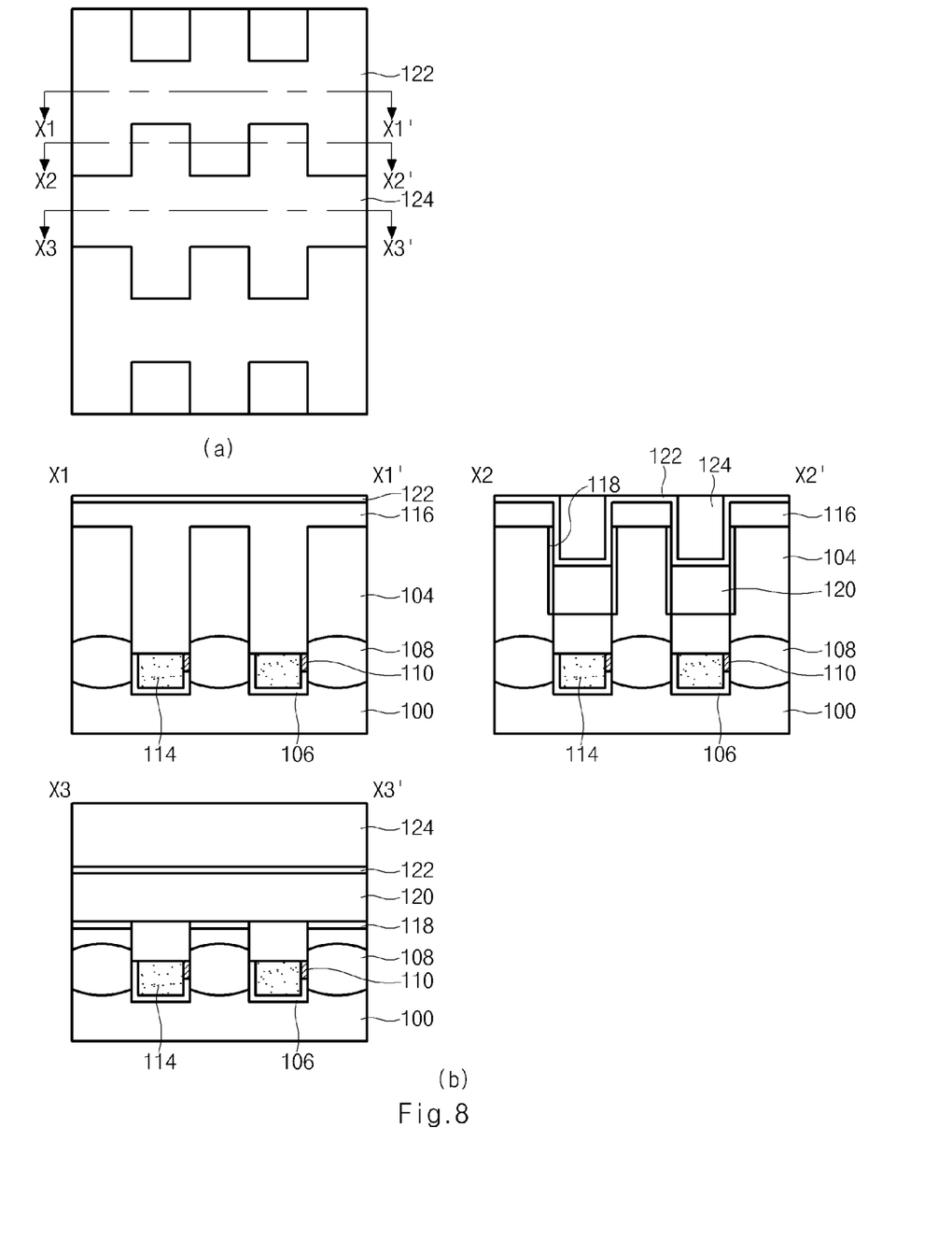

Referring to FIG. 8, an insulating layer, for example, an oxide layer (not shown), is formed on the surface of the semiconductor substrate 100 to fill the trench 102 on the vertical gate 120. The insulating layer is then planarized to form an interlayer insulating layer 124 on the vertical gate 120, until the sealing nitride layer 122 is exposed.

Figure 9:
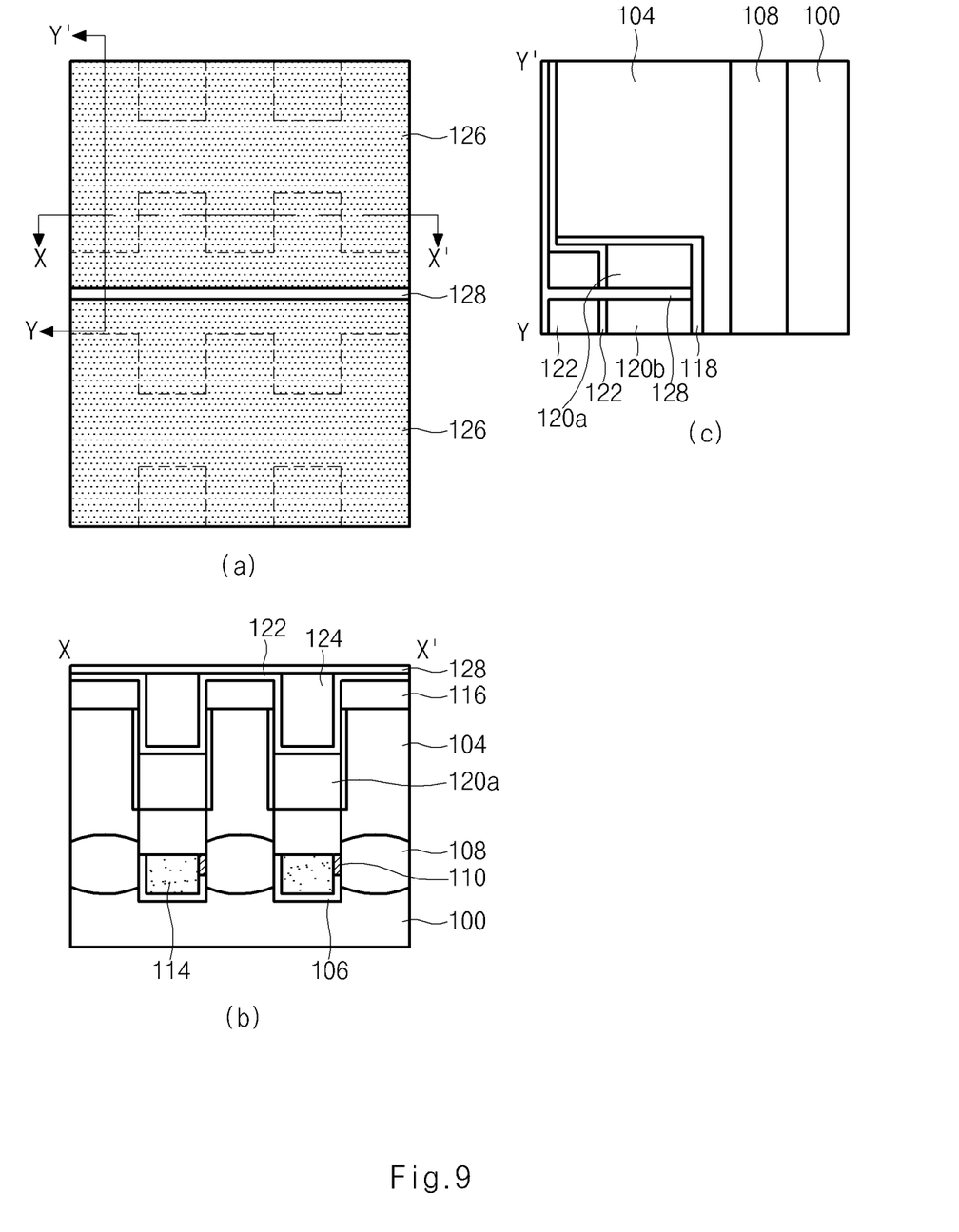

Referring to FIG. 9, the interlayer insulating layer 124, the sealing nitride layer 122, and the vertical gate 120 are etched using a vertical gate isolation mask 126 (a deviant crease lined portion of FIG. 9) until the oxide layer 118 of the vertical gate region is exposed to form a vertical gate isolation trench.

Next, a sealing nitride layer 128 is formed on the surface of the semiconductor substrate 100 to fill the vertical gate isolation trench and then planarized to device-isolate the vertical gate 120. That is, the vertical gate 120 is device-isolated into two vertical gates 120a and 120b, which are symmetrical to each other, by the sealing nitride layer 128. The vertical gate isolation mask 126 is shown in the plan view of FIG. 9(a), but not in cross-sectional views of FIGS. 9(b) and 9(c). The sealing nitride layer 128 may be formed of any insulating material. The embodiment described herein uses nitride only as an example.

Figure 10:
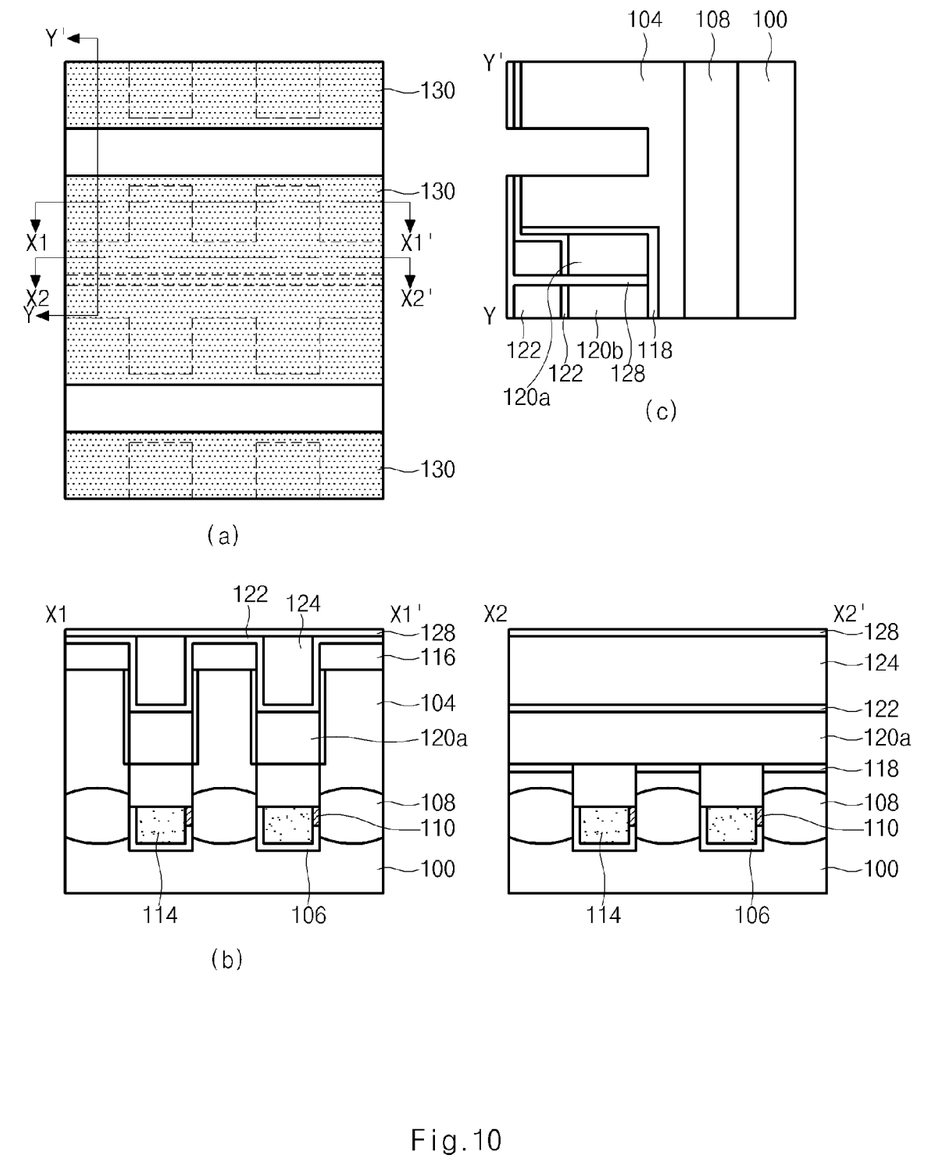

Referring to FIG. 10, using a body mask 130 defining a body line region (a deviant crease lined portion of FIG. 10), the sealing nitride layers 128 and 122, the vertical gate 120, and the first pillar pattern 104 are sequentially etched to form a body line trench. As a result, the first is pillar pattern 104 is divided into two second pillar patterns 104, which are symmetrical to each other with respect to the body line trench. The second pillar patterns 104 corresponds to the element denoted with the reference numeral 12 in FIG. 1 with respect to the body line trench. Also, the vertical gate 120 is divided into two symmetric second vertical gates 120a and 120b. The body line trench is formed so that the capping nitride layer 116 is exposed at a sidewall of the body line trench. Due to the capping nitride layer 116, neither the vertical gates 120a and 120b nor the second pillar patterns 104 are exposed at a sidewall of the body line trench.

Figure 11:
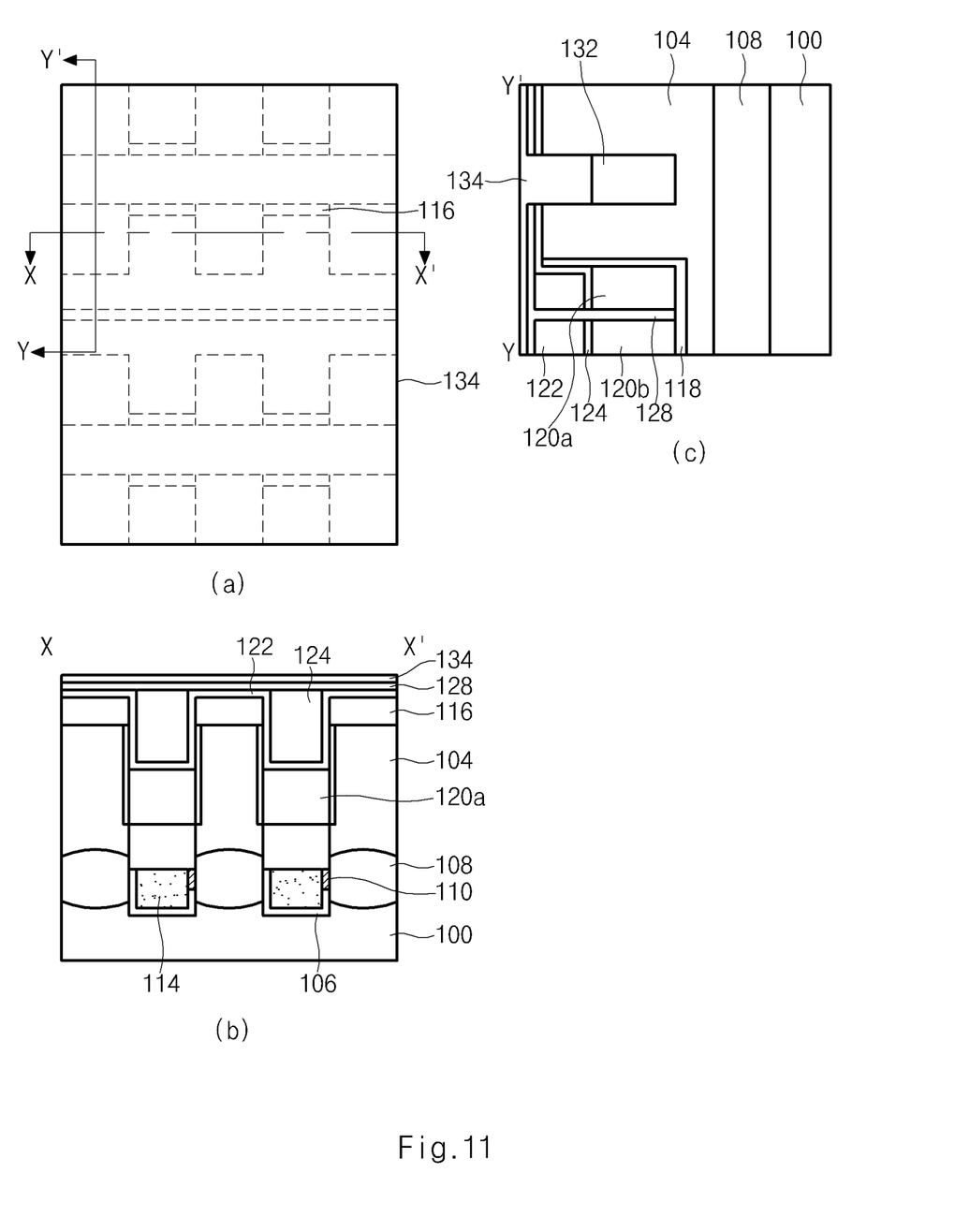

Referring to FIG. 11, a conduction layer (not shown) is filled within the body line trench and then planarized using a CMP process. At this time, the conduction layer may include tungsten. Subsequently, the conduction layer is etched back to have a height level similar to heights of the vertical gates 120a and 120b so that the body line 132 is formed in a lower portion of the trench.

Next, an interlayer insulating layer 134 fills the trench on the body line 132 and is then planarized.

In the above exemplary embodiment, the vertical gate is formed to surround three sidewalls of four sidewalls of the active pillars, and the body line is in contact with one side of the active pillar. However, it is not limited thereto. For example, the vertical gate and the body line may be formed to be in contact with two sidewalls of the active pillar. Alternatively, the vertical gate may be formed in the same type as the body line so that the vertical gate is in contact with one sidewall of the is active pillar.

In addition, if the active pillar is formed in a cylinder pillar type, approximately ¾ portion of a side of the active pillar may be in contact with the vertical gate and a remaining ¼ portion of the side may be in contact with the body line.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A vertical semiconductor device, comprising: a first active pillar vertically protruded from a semiconductor substrate; a first vertical gate coupled to at least one side of the first active pillar and formed along a direction that intersects with a buried bit line;
   a first body line directly connected to at least one side of the first active pillar which is not coupled to the first vertical gate; and
   a fourth active pillar sharing the first vertical gate with the first active pillar, wherein the first body line is directly and commonly connected to the first active pillar and the fourth active pillar for discharging holes accumulated in the first active pillar and the fourth active pillar.

2. The vertical semiconductor device of claim 1, further comprising:
   an insulating layer formed over a sidewall of the first vertical gate;

a second vertical gate formed symmetrically to the first vertical gate with respect to the insulating layer;

a second active pillar of which at least one side is coupled to the second vertical gate; and a second body line formed symmetrically to the first body with respect to the insulating layer and connected to at least one side of the second active pillar which is not connected to the second vertical gate.

3. The vertical semiconductor device of claim 1, further comprising:

a third active pillar formed symmetrically to the first active pillar with respect to the first body line and coupled to the first body line; and a third vertical gate formed symmetrically to the first vertical gate with respect to the first body line and connected to at least one side of the third active pillar which is not connected to the first body line.

4. The semiconductor device of claim 1, wherein the first body line is a line type parallel to the first vertical gate.

5. The semiconductor device of claim 1, wherein the first vertical gate is formed to surround the first active pillar in a U-shape.

6. The semiconductor device of claim 1, wherein when the first active pillar is a four-sided pillar type, the first gate is formed to surround a first, a second, and a third side of the first active pillar.

7. The semiconductor device of claim 6, wherein the first body line is coupled to a fourth side of the first active pillar.

* * * * *